United States Patent
Bhugra et al.

(10) Patent No.: US 7,120,731 B1
(45) Date of Patent: Oct. 10, 2006

(54) CAM-BASED SEARCH ENGINES THAT SUPPORT PIPELINED MULTI-DATABASE SEARCH OPERATIONS USING REPLACEMENT SEARCH KEY SEGMENTS

(75) Inventors: Harmeet Bhugra, San Jose, CA (US); Kenneth Branth, Redwood City, CA (US); John R. Mick, Jr., Sunnyvale, CA (US); Jakob Saxtorph, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 500 days.

(21) Appl. No.: 10/688,353

(22) Filed: Oct. 17, 2003

Related U.S. Application Data

(63) Continuation-in-part of application No. 10/620,161, filed on Jul. 15, 2003, now Pat. No. 7,058,757.

(51) Int. Cl.
*G06F 12/06* (2006.01)
(52) U.S. Cl. .............................. 711/108; 365/49; 706/50
(58) Field of Classification Search ................ 711/108; 365/49; 706/50
See application file for complete search history.

(56) References Cited

U.S. PATENT DOCUMENTS

| | | | |
|---|---|---|---|
| 6,374,326 B1 | 4/2002 | Kansal et al. | |
| 6,526,474 B1 | 2/2003 | Ross | |
| 6,606,681 B1 * | 8/2003 | Uzun | 711/108 |
| 6,763,426 B1 | 7/2004 | James et al. | 711/108 |
| 2001/0044876 A1 * | 11/2001 | Brown | 711/108 |
| 2002/0152352 A1 * | 10/2002 | Ikegai et al. | 711/108 |

OTHER PUBLICATIONS

CommsDesign, LA-1: Examining the Look-Aside Processor Interface, http://www.commsdesign.com/story/OEG20030520S0008, May 20, 2003, 6 pages.

* cited by examiner

*Primary Examiner*—Brian R. Peugh
(74) *Attorney, Agent, or Firm*—Myers Bigel Sibley & Sajovec PA

(57) ABSTRACT

CAM-based search engines may be configured to support multiple databases within a CAM core. These databases may represent tables for different applications, which can be searched sequentially in response to a single indirect instruction that is loaded during a control cycle. The databases to be searched may be identified by a multi-database search instruction that is loaded during a single data cycle, which may overlap with the control cycle. In some cases, the databases may be searched using variations of a primary search key, so that it is unnecessary to repeatedly load the entire search key across a network interface for each search operation within a respective database. Instead, shorter replacement key segments may be loaded for each of a plurality of the search operations and these replacement key segments may be combined with one or more segments of the primary search key in the CAM core to define a desired search key for a respective search operation.

20 Claims, 9 Drawing Sheets

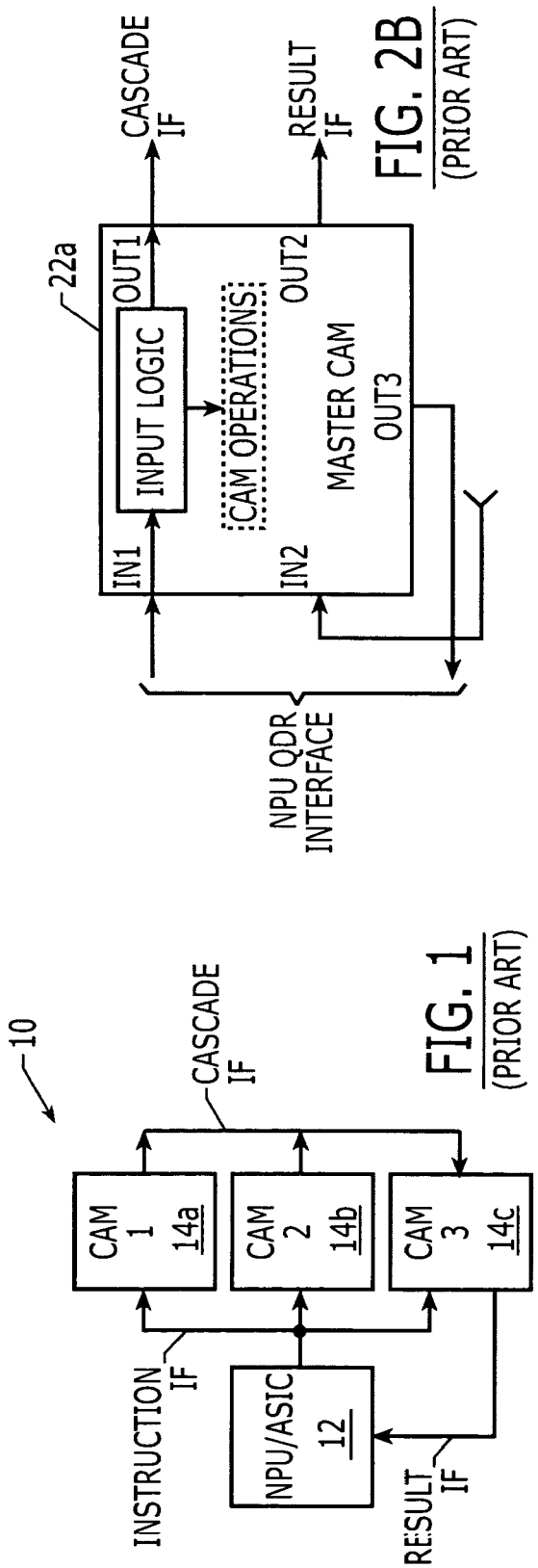

| DATABASE | VALID BIT | NEXT FREE ADDRESS |
|---|---|---|
| DB1 | V1 | NFA 1 |
| DB2 | V2 | NFA 2 |
| DB3 | V3 | NFA 3 |
| DB4 | V4 | NFA 4 |
| DB5 | V5 | NFA 5 |
| DB6 | V6 | NFA 6 |
| DB7 | V7 | NFA 7 |
| DB8 | V8 | NFA 8 |
| DB9 | V9 | NFA 9 |
| DB10 | V10 | NFA 10 |
| DB11 | V11 | NFA 11 |
| DB12 | V12 | NFA 12 |
| DB13 | V13 | NFA 13 |
| DB14 | V14 | NFA 14 |
| DB15 | V15 | NFA 15 |
| DB16 | V16 | NFA 16 |

NFA TABLE

FIG. 3D

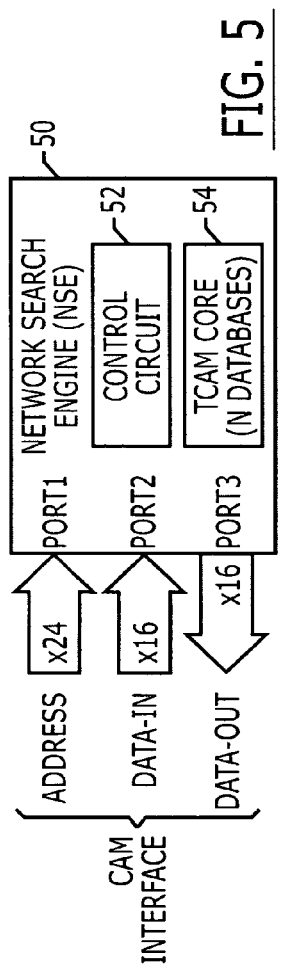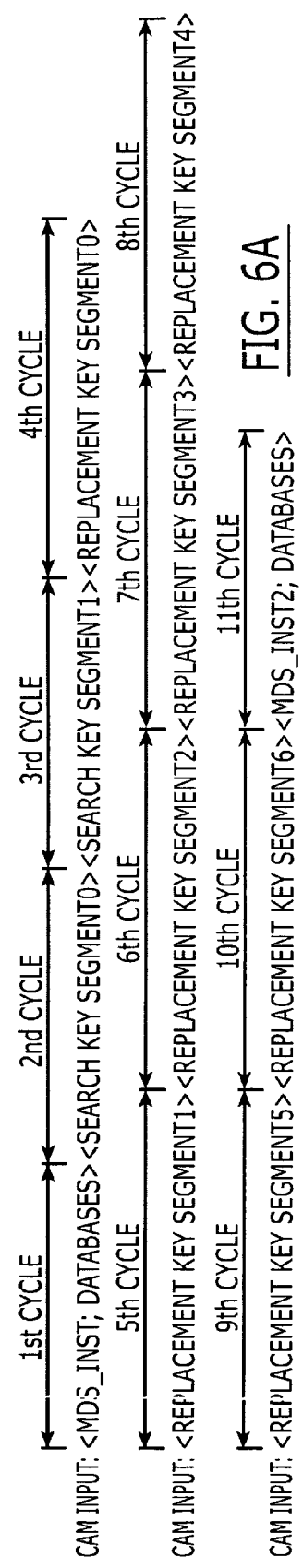

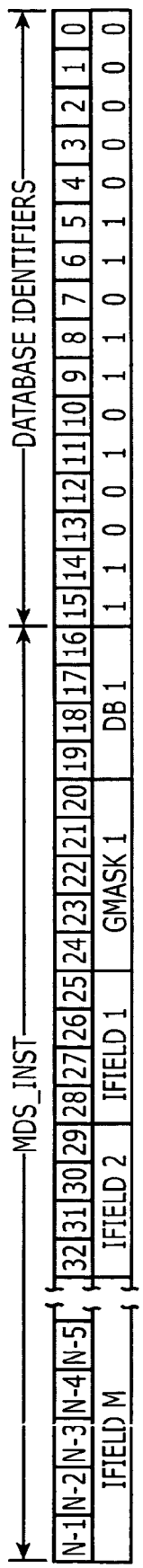

FIG. 6B

| SEARCH NO. | SEARCH KEY | + | GLOBAL MASK | → | SEARCH WORD | DATABASE |
|---|---|---|---|---|---|---|
| 1 | <KEY SEGMENT0><KEY SEGMENT1> | + | GMASK1 | → | SEARCH WORD 1 | 3 |
| 2 | <REPLACEMENT SEGMENT0><KEY SEGMENT1> | + | GMASK2 | → | SEARCH WORD 2 | 5 |
| 3 | <REPLACEMENT SEGMENT1><KEY SEGMENT1> | + | GMASK3 | → | SEARCH WORD 3 | 6 |
| 4 | <REPLACEMENT SEGMENT2><KEY SEGMENT1> | + | GMASK4 | → | SEARCH WORD 4 | 8 |
| 5 | <REPLACEMENT SEGMENT3><KEY SEGMENT1> | + | GMASK5 | → | SEARCH WORD 5 | 9 |
| 6 | <REPLACEMENT SEGMENT4><KEY SEGMENT1> | + | GMASK6 | → | SEARCH WORD 6 | 11 |
| 7 | <REPLACEMENT SEGMENT5><KEY SEGMENT1> | + | GMASK7 | → | SEARCH WORD 7 | 14 |
| 8 | <REPLACEMENT SEGMENT6><KEY SEGMENT1> | + | GMASK8 | → | SEARCH WORD 8 | 15 |

FIG. 6C

CAM-BASED SEARCH ENGINES THAT SUPPORT PIPELINED MULTI-DATABASE SEARCH OPERATIONS USING REPLACEMENT SEARCH KEY SEGMENTS

REFERENCE TO PRIORITY APPLICATION

This application is a continuation-in-part (CIP) of U.S. application Ser. No. 10/620,161, filed Jul. 15, 2003, now U.S. Pat. No. 7,058,757 the disclosure of which is hereby incorporated herein by reference.

FIELD OF THE INVENTION

The present invention relates to integrated circuit devices that support search operations and, more particularly, to CAM-based search engines and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data is not accessed by initially supplying an address, but rather by initially applying data (e.g., search words) to the device and then performing a search operation to identify one or more entries within the CAM device that contain data equivalent to the applied data and thereby represent a "match" condition. In this manner, data is accessed according to its content rather than its address. Upon completion of the search operation, the identified location(s) containing the equivalent data is typically encoded to provide an address (e.g., CAM array block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM device to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. The '613 patent also discloses the use of CAM sub-arrays to facilitate pipelined search operations. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array block having a plurality of entries therein of logical width N, then a search operation will yield one or more match conditions whenever all the unmasked data bits of an entry in the ternary CAM array block are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}.

A plurality of CAM devices may be configured to operate as a search engine that is responsive to instructions generated by a network processing unit (NPU) or other application specific integrated circuit (ASIC). FIG. 1 illustrates a conventional integrated circuit system 10 that utilizes a parallel arrangement of CAM devices 14a–14c and an NPU/ASIC device 12 to perform the functions of a search engine. In this system 10, all CAM devices receive instructions from the NPU 12 at the same time and the results generated by the CAM devices are passed to the last CAM device (CAM 3), which returns a result to the NPU 12. The system 10 includes three primary buses: INSTRUCTION IF (instruction interface bus), CASCADE IF (cascade interface bus) and RESULT IF (result interface bus). The performance of the system of FIG. 1 may be limited by the interface degradation that is typically present when a relatively large number of CAM devices are all loading from the same interface bus (e.g., INSTRUCTION IF).

FIGS. 2A–2B illustrate another integrated circuit system 20 that utilizes a serial cascaded arrangement of master and slave CAM devices 22a–22c to perform the functions of a search engine. Each CAM device is illustrated as having five ports: IN1, IN2, OUT1, OUT2 and OUT3. Input logic is provided between the first input port IN1 and the first output port OUT1. This input logic may be responsible for inspecting and/or altering instructions and/or decomposing instructions into multiple subordinate instructions to be performed by one or more slave CAM devices. The master CAM device 22a is responsible for, inspecting/interpreting and scheduling the instructions the NPU issues to the search engine. These instructions may be issued across a quad data rate (QDR) interface bus, as illustrated. For example, the master CAM device 22a may hold information that is used to translate an indirect address to an absolute address when executing instructions, including read and write instructions. The absolute address is transferred from the master CAM device 22a to the slave CAM devices 22b and 22c in combination with an instruction. Additional cascaded arrangements of CAM devices are illustrated in FIG. 1 of U.S. Pat. No. 6,148,364, FIG. 13 of U.S. Pat. No. 6,240,485 and in U.S. Pat. Nos. 6,137,350, 6,490,650 and 6,493,793. In FIG. 1 of the '364 patent, an instruction bus IBUS is connected to two depth cascaded CAM devices. The '485 patent describes a method and apparatus for implementing a learn instruction in a depth cascaded CAM system.

Notwithstanding these conventional CAM systems that support multi-database search operations, the bandwidth of the NPU interface may be constrained by a typical requirement that each new search key to be used in a search operation be consecutively supplied to the CAM system as a separate word. Accordingly, if a significant percentage of the search words are long words (e.g., N×72 bits, where N≧2), then a relatively large number of data cycles may be required to transfer consecutive search keys across the NPU interface. In these situations, the NPU interface may operate as a bottleneck to system performance.

SUMMARY OF THE INVENTION

Integrated circuit devices according to embodiments of the present invention include CAM-based search engines, which may be operated independently, in parallel with each other or in cascaded chain networks. A search engine may be configured to support multiple databases within a CAM core that resides on the same chip with control logic. These databases may represent tables for different applications, which can be searched sequentially in response to a single indirect instruction that is loaded during a control cycle. The databases to be searched may be identified by a multi-database search instruction that is loaded during a single data cycle, which may overlap with the control cycle. In some cases, the databases may be searched using variations of a primary search key. In these cases, it is unnecessary to repeatedly load the entire search key across a CAM interface for each search operation within a respective database. Instead, shorter replacement key segments may be loaded for each of a plurality of the search operations and these replacement key segments may be combined with one or more segments of the primary search key to define a desired search key for a respective search operation. This search key may constitute a search word (i.e., comparand) that is applied to a database within the CAM core or the search key may be modified by a global mask stored within the search engine.

According to these embodiments, a search engine is provided that is configured to support a plurality of consecutive search operations in a corresponding plurality of databases within an internal CAM core using a corresponding plurality of search keys. These search keys include a first search key (e.g., primary search key) that requires multiple data cycles to load into the search engine before a first search of a first one of the plurality of databases is performed using a first search word derived from the first search key. These multiple data cycles may follow the loading of a data word that comprises a multi-database search instruction and an encoded multi-database sub-word that identifies the plurality of databases to be searched.

The plurality of search keys also include at least a second search key. This second search key comprises a replacement search key segment and at least one search key segment from the already received first search key. In response to receipt of the replacement search key segment, a second search of a second one of the plurality of databases may be performed using a second search word derived from the second search key. Thus, a second search of the second database may be performed without requiring multiple data cycles to load the entire second search key. In alternative embodiments, the plurality of search keys may include a first search key that requires at least one data cycle to load into the search engine before a search of a first of the plurality of databases is performed using a search word that is derived from the first search key. This plurality of search keys may also include a longer second search key that comprises at least one search key segment from the first search key and another search key segment that is loaded into said search engine after the first search key. In these latter embodiments, it is unnecessary for the first search key to be the longest search key.

Content addressable memory (CAM) devices according to still further embodiments of the present invention include CAM logic that is configured to pass an instruction received at an instruction input port of a CAM device to an instruction output port without inspection or alteration. This enables the CAM devices to be operated efficiently as equivalent devices within a cascaded chain of CAM devices that collectively form multiple databases within a search engine having distributed CAM control. This CAM logic may include an input instruction register that is configured to latch the instruction received at the instruction input port and an output instruction register that is configured to latch the instruction received from the input instruction register. This CAM logic may also include an instruction FIFO that is configured to buffer instructions received from the input instruction register.

Methods of operating a cascaded chain of CAM devices are also provided. These methods may include performing a learn operation in the cascaded chain of CAM devices by sequentially passing a learn instruction through a plurality of CAM devices in the cascaded chain, without inspection or alteration. In the event the plurality of CAM devices are configured to include next free address (NFA) tables therein, then the performing step may include writing a search key into a CAM core within a selected one of the plurality of CAM devices, in response to evaluating whether an NFA table in the selected one of the plurality of CAM devices has a valid NFA address for the search key. This performing step may also include evaluating each of the NFA tables in the plurality of CAM devices to determine whether a valid NFA address for the search key is present. In particular, the step of evaluating each of the NFA tables in the plurality of CAM devices may be performed as an operation that starts first in a highest priority CAM device and starts last in a lowest priority CAM device, with the starting times being offset by the number of cycles of latency associated with each CAM device.

Additional methods of operating a cascaded chain of CAM devices may include performing a learn operation in the cascaded chain of CAM devices by writing a search key associated with a database into a selected one of the cascaded chain of CAM devices, in response to evaluating whether an NFA table in the selected one of the cascaded chain of CAM devices has a valid NFA address for the search key, and then searching each of the CAM devices in the cascaded chain to identify an address of a highest priority invalid entry in a CAM device that retains the database. The address of this highest priority invalid entry is then written into an NFA table within the CAM device containing the highest priority invalid entry.

BRIEF DESCRIPTION OF THE DRAWINGS

FIG. 1 is a block diagram of a conventional integrated circuit system that utilizes a parallel arrangement of CAM devices, which are connected to a network processing unit (NPU) or application specific integrated circuit (ASIC).

FIG. 2A is a block diagram of a conventional integrated circuit system that utilizes a cascaded arrangement of master and slave CAM devices as a search engine.

FIG. 2B is a block diagram of a master CAM device used in the system of FIG. 2A.

FIG. 3D is an illustration of a next free address (NFA) table, which retains valid bit data and address data associated with one or more databases within a CAM core of a CAM device.

FIG. 5 is a block diagram of a search engine device having multiple databases therein, according to another embodiment of the present invention.

FIG. 6A is a diagram that illustrates the timing of a stream of instructions that can be provided to the search engine device of FIG. 5.

FIG. 6B illustrates a word having a multi-database instruction field (MDS_INST) and an encoded multi-database identifier field therein.

FIG. 6C is a table that illustrates how search words may be generated within the search engine device of FIG. 5.

DETAILED DESCRIPTION OF PREFERRED EMBODIMENTS

Figure 3A:
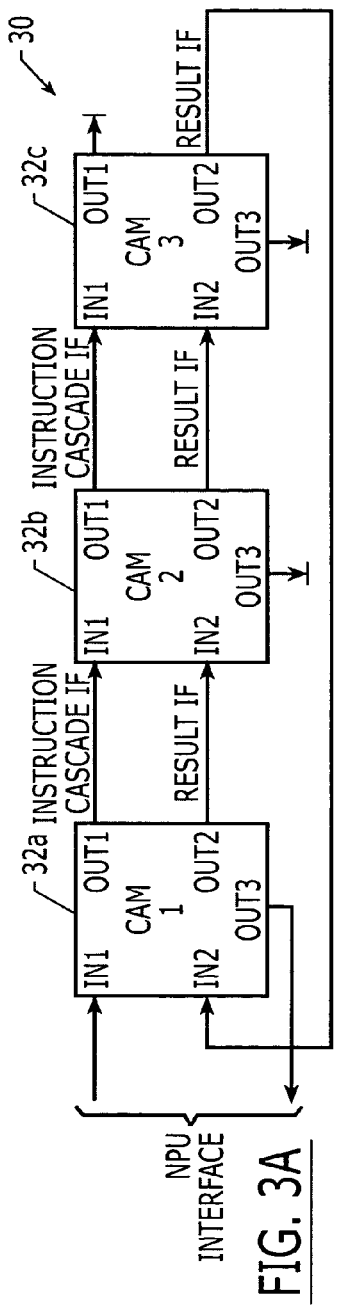
FIG. 3A is a block diagram of a cascaded arrangement of CAM devices that utilizes a distributed control architecture, according to an embodiment of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. Moreover, when a device or element is stated as being responsive to a signal(s), it may be directly responsive to the signal(s) or indirectly responsive to the signal(s) (e.g., responsive to another signal(s) that is derived from the signal(s)).

Referring now to FIGS. 3A–3D, an integrated circuit system will be described that utilizes content addressable memory (CAM) devices within a search engine. As illustrated by FIG. 3A, this system includes a cascaded arrangement of CAM devices 30 that is configured to communicate with a network processing unit (NPU) via a network interface bus. The cascaded arrangement of CAM devices 30 is shown as including three (3) CAM devices 32a, 32b and 32c, which may be mounted as separate integrated circuit chips on a printed circuit board (not shown). The CAM devices may be arranged according to priority, with the first CAM device 32a having the highest physical priority and the third CAM device 32c having the lowest physical priority. In a typical search engine, sixteen (16) or more CAM devices may be provided in a cascaded arrangement. Other priority arrangements and numbers of devices may also be possible.

The CAM devices 32a, 32b and 32c are shown as having five ports (IN1, IN2, OUT1, OUT2 and OUT3), however, CAM devices having more or less ports may be used. The ports IN1 and OUT3 associated with the first CAM device 32a communicate with a network processing unit (NPU) via an NPU interface bus. The output ports OUT1 and OUT2 of the first CAM device 32a pass instructions and results onto an instruction cascade interface bus (Instruction Cascade IF) and a result interface bus (Result IF), as illustrated. The result interface bus may include a signal line that passes a hit signal (HIT) from an "upstream" CAM device having higher priority to a "downstream" CAM device having lower priority. The second CAM device 32b receives instructions at its first input port IN1 and passes these instructions to its first output port OUT1. The second CAM device 32b also receives upstream results at its second input port IN2 and generates results at its second output port OUT2. The third output ports OUT3 of the second and third CAM devices 32b and 32c are not used in the illustrated embodiment. The third CAM device 32c receives instructions at its first input port IN1, however, because it is the last CAM device within the cascaded chain, the first output port OUT1 is not used to pass instructions downstream. The third CAM device 32b also receives upstream results at its second input port IN2 and generates final results at its second output port OUT2. The final results (Result IF) are passed to the second input port IN2 of the first CAM device 32a. The third output port OUT3 is not used. As described more fully hereinbelow, the CAM devices 32a, 32b and 32c provide a multi-cycle delay to instructions received at the first input port IN1, and pass these instructions to the first output port OUT1 without inspection or alteration.

Figure 3B:
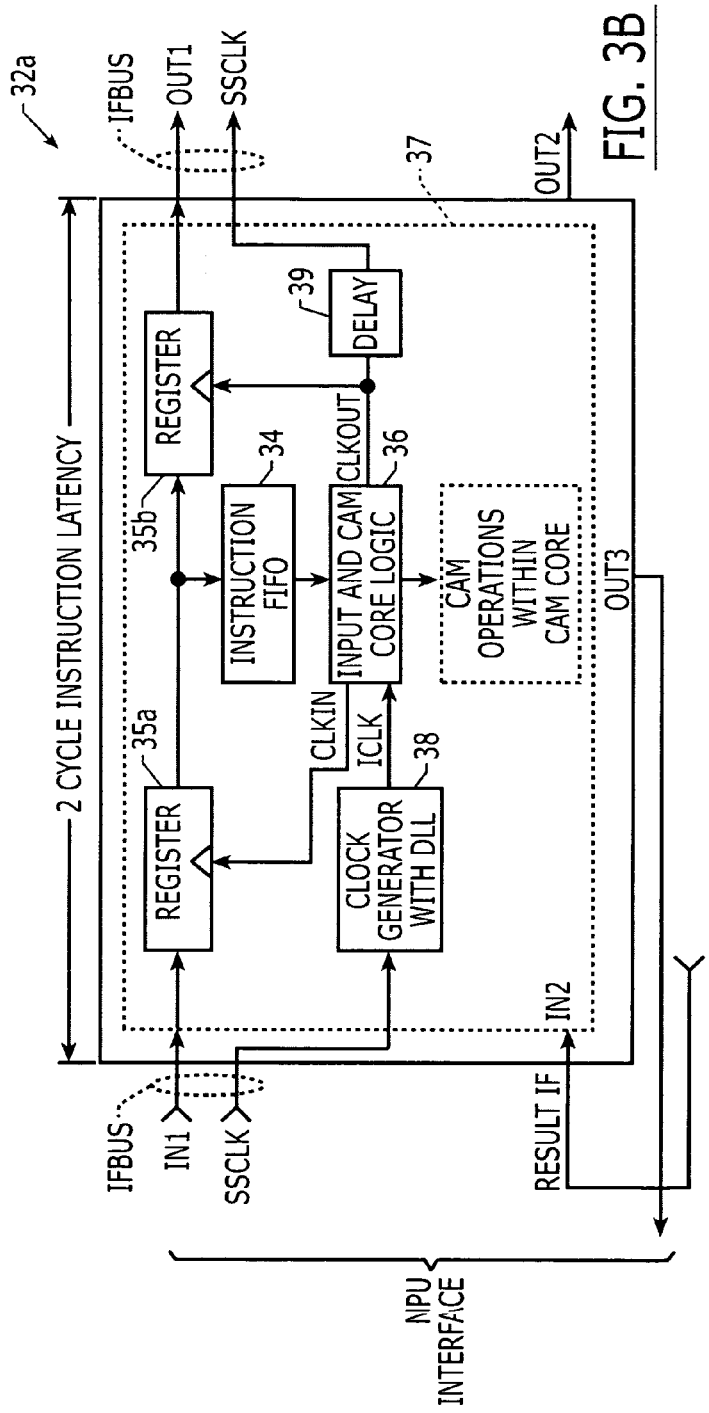
FIG. 3B is a block diagram of a CAM device used in FIG. 3A.

As illustrated by FIG. 3B, the first CAM device 32a including CAM logic 37. One of the functions of this CAM logic is to provide a two cycle latency to received instructions, but otherwise leave the instructions intact. A first cycle of latency is typically incurred when the received instruction passes into the first input port (IN1) and is latched into an input register 35a and a second cycle of latency is incurred when the latched instruction is passed to an output register 35b and reproduced at the first output port OUT1. These operations may also apply to segments of an instruction word in the event the first input port IN1 and first output port OUT1 are narrower than the width of the instruction word. In other embodiments, a latency less than or greater than two cycles may be present between the receipt of an instruction at the first input port IN1 and the passing of the same instruction to the first output port OUT1. The input and output registers 35a and 35b are illustrated as being responsive to input and output clock signals (CLKIN and CLKOUT). These clock signals may be generated internally by input and CAM core logic 36. This logic 36, which is responsible for controlling CAM operations within a CAM core, may be synchronized to an internal clock signal (ICLK) that is generated by a clock generator 38. This clock generator 38 may include a delay locked loop (DLL) that operates to synchronize internal clock signals with an external clock signal. This external clock is illustrated as a "source synchronous" clock (SSCLK) that may accompany incoming data. An output SSCLK may be generated by a delay device 39 that receives the output clock signal CLKOUT. The input and CAM core logic 36 may be of conventional design and need not be described more fully herein.

In some preferred embodiments, an instruction FIFO 34 is provided to maintain a queue of pending instructions and to provide these instructions in a first-in first-out sequence to the logic 36. For example, in the event the network processing unit (NPU), not shown, is capable of handling multiple contexts (e.g., 128 independent contexts), the instructions issued by these various contexts may be maintained in the instruction FIFO 34 within each CAM device in the cascaded chain. If each CAM device provides a two cycle instruction latency, then the offset between the queue of instructions within first and Nth CAM devices in a cascaded chain will equal 2(N−1) cycles.

The CAM devices within the cascaded chain are configured to operate in a system that supports a distributed CAM control architecture. In this architecture, indirect information, including next free address (NFA) table information, is distributed to all of the CAM devices in the chain and all of the CAM devices decode instructions in the same manner, albeit typically delayed by an integer multiple of two or more cycles. Thus, it is unnecessary to program the first CAM device in the chain (i.e., the highest priority CAM device) to operate as a master CAM device and the other CAM devices to operate as slave devices, as described above with respect to FIG. 2A.

Figure 3C:
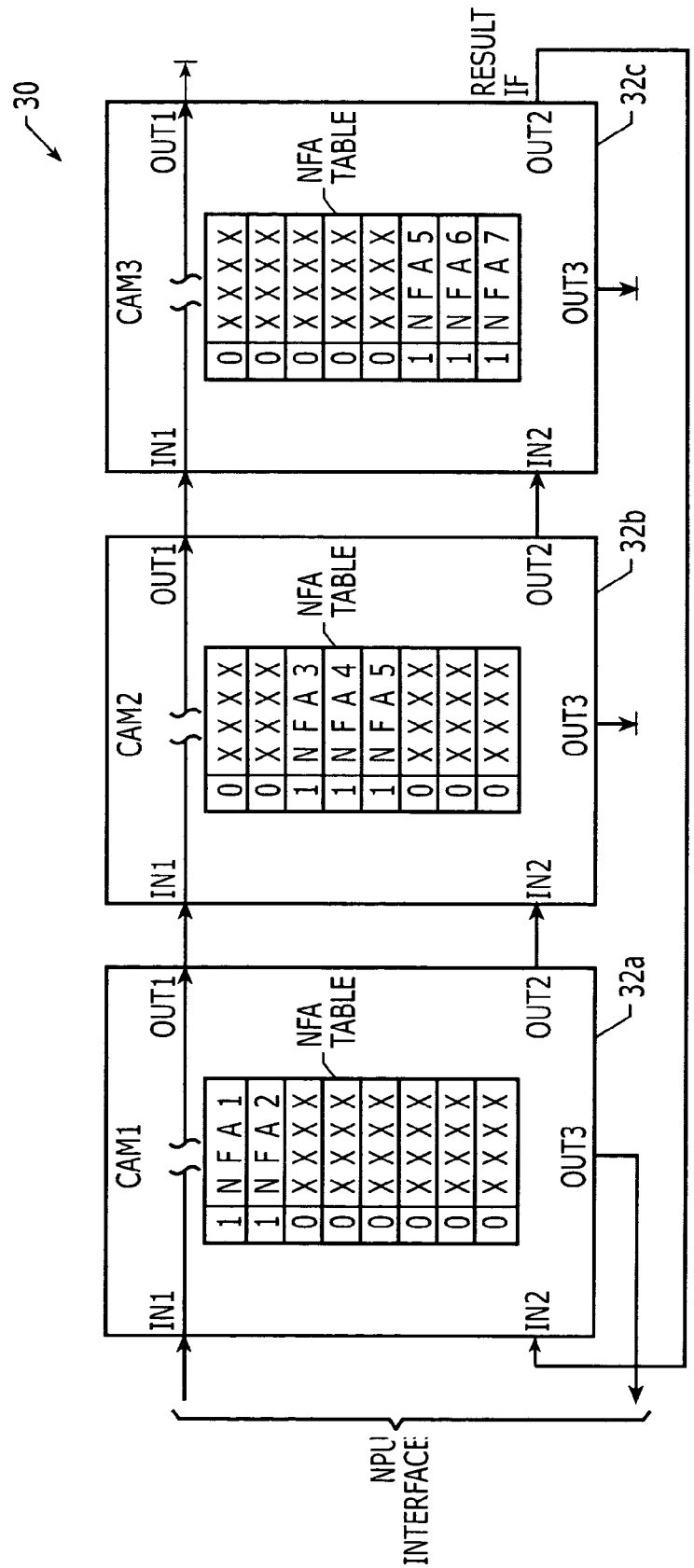
FIG. 3C is a block diagram of a cascaded arrangement of CAM devices that utilizes the distributed control architecture of FIG. 3A, with each CAM device having a next free address (NFA) table therein.

FIG. 3C provides a further illustration of the cascaded arrangement of CAM devices 30 of FIG. 3A, having next free address (NFA) tables therein. For sake of clarity, other elements of the CAM devices have been omitted. The NFA table within the first CAM device 32a identifies two valid next free addresses (NFA1 and NFA2) associated with first and second databases (DB1 and DB2). The address values "XXXX" represent "don't care" values associated with databases that are present in other CAM devices (this condition is identified by a valid bit that has been set to an inactive level (e.g., binary 0). The NFA table within the second CAM device 32b identifies three valid next free addresses (NFA3, NFA4 and NFA5) associated with third, fourth and fifth databases. Finally, the NFA table within the third CAM device 32c identifies three valid next free addresses (NFA6, NFA7 and NFA8) associated with sixth, seventh and eighth databases. As will be understood by those skilled in the art, a database may represent one or more CAM array blocks (or sector(s)) that span one or more CAM devices, within each block including a plurality of consecutive CAM entries.

FIG. 3D illustrates an NFA table that may be utilized in a CAM device 30 that is capable of supporting as many as sixteen databases. CAM devices that are capable of supporting a fewer or larger number of databases are also possible. When utilized within a cascaded chain of CAM devices, a single database may span two or more CAM devices. Thus, it is not impossible for an NFA table within a CAM device to have no valid NFA values (i.e., all valid bits V1, V2, . . . , V16=0). The NFA table illustrated by FIG. 3D is reproduced in FIGS. 4A–4B.

Figure 4A:
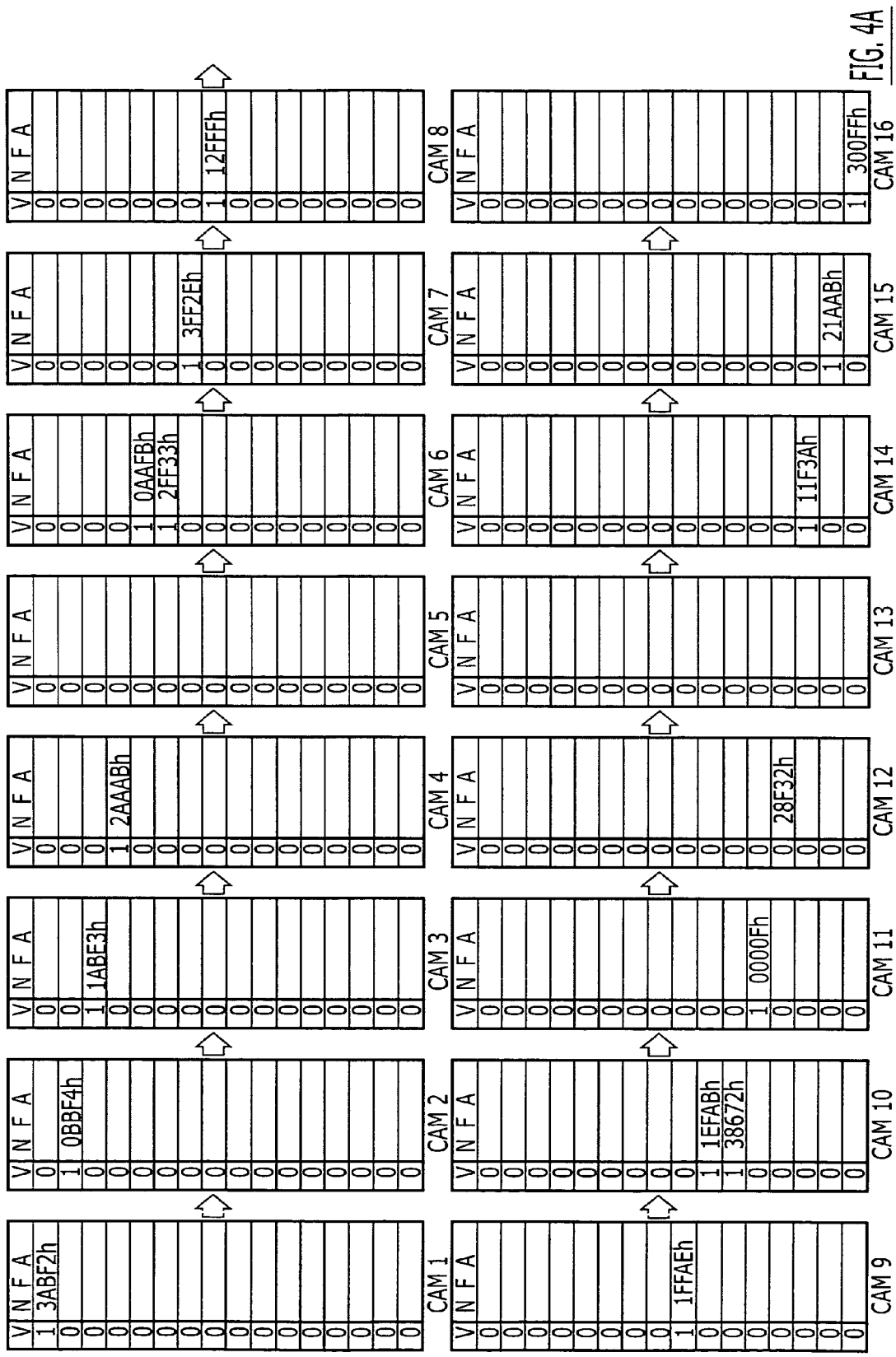
FIGS. 4A–4B illustrate sixteen NFA tables associated with sixteen CAM devices that are connected in a cascaded arrangement and support distributed control. The entries in the NFA tables of FIG. 4B have been updated to reflect the performance of three learn instructions into databases 1, 4 and 14.
Figure 4B:
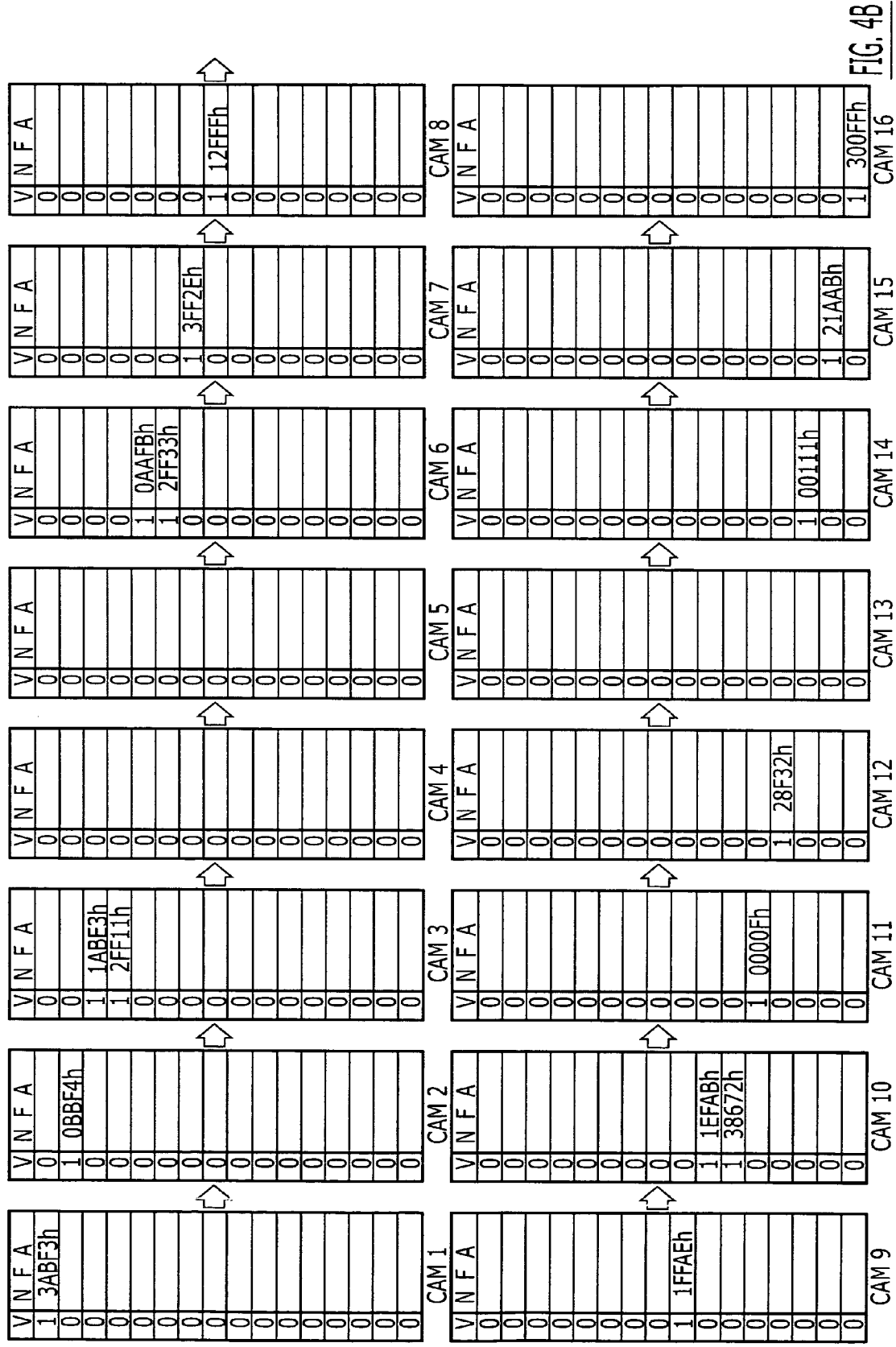

In particular, FIGS. 4A–4B illustrate hypothetical "before" and "after" snapshots of valid entries within sixteen NFA tables that are contained within a cascaded chain of sixteen CAM devices that has received three learn instructions. The CAM devices are treated herein as having $2^{18}$ entries which span an address space of 00000h to 3FFFFh. As will be understood by those skilled in the art, this address space may be defined by a CAM core having 128 CAM array blocks with 2048 entries/block. The entries within a CAM array block may include three searchable fields: a valid bit field (e.g., 1 bit), a database field (e.g., 4 bits) and a data field (e.g., 72 bits). Other searchable and/or non-searchable fields may also be provided.

A learn instruction may be issued by a network processing unit (NPU) when a previously issued search instruction concludes with an absence of any valid hits within the cascaded chain of CAM devices. A learn instruction is internally decoded into two consecutive operations within each of the CAM devices. These operations are a "WRITE" operation, which writes a "new" search key into a specified database, followed by a "SEARCH" operation to identify an new next free address for that specified database. During the WRITE operation, each CAM device performs a preliminary operation(s) to check its NFA table to see whether a valid next free address is available within the specified database. Only one next free address is possible amongst the sixteen CAM devices. If a valid next free address is available, then the new search key to be learned is written into the CAM device at an address specified in the corresponding NFA table. The valid bit of the CAM entry receiving the new search key is also set to an active level so that the entry is available for searching whenever the next search instruction is issued by the NPU. Because a two-cycle latency may be present between each CAM device in the chain, the highest priority CAM device, which is the first in the chain, performs its learn operations first and all other CAM devices start their learn operations in sequence.

The SEARCH operation associated with a learn instruction is also performed within each CAM device in the chain. This operation involves looking for the next free entry for the specified database and returning the address of the next free entry to the corresponding NFA table. To perform this search operation, a special search key may be used that has its valid bit field set to 0, its database field set to the corresponding database that was just updated with the new search key and its data field globally masked. This search operation may result in multiple hits within the same CAM device and even across two or more CAM devices. Each of the hits represents a matching entry having an invalid status within the specified database. However, only the highest priority matching entry within the highest priority CAM device is selected when updating the NFA table. The entry address (e.g., CAM array block address+row address) of the highest priority matching entry is written into the NFA table and the corresponding valid bit within the NFA table is set to indicate a valid next free address. As will be understood by those skilled in the art, the earlier generation of a HIT signal by an upstream CAM device can be used to disable further processing of HIT signals (and NFA table updates) within all downstream CAM devices.

These learn operations are further illustrated by FIGS. 4A–4B. In FIG. 4A, the sixteen NFA tables identify hypothetical CAM core entry addresses for the next free entries within sixteen databases. These next free addresses are illustrated by TABLE 1.

TABLE 1

| DATABASE | NEXT FREE ADDRESS | ADDRESS AFTER LEARN |
|---|---|---|
| 1 | 3ABF2h–CAM1 | 3ABF3h (moved down in CAM1) |
| 2 | 0BBF4h–CAM2 | NC |
| 3 | 1ABE3h–CAM3 | NC |
| 4 | 2AAABh–CAM4 | 2FF11h (moved up to CAM 3) |
| 5 | 0AAFBh–CAM6 | NC |
| 6 | 2FF33h–CAM6 | NC |
| 7 | 3FF2Eh–CAM7 | NC |

TABLE 1-continued

| DATABASE | NEXT FREE ADDRESS | ADDRESS AFTER LEARN |
|---|---|---|
| 8 | 12FFFh–CAM8 | NC |
| 9 | 1FFAEh–CAM9 | NC |
| 10 | 1EFABh–CAM10 | NC |
| 11 | 38672h–CAM10 | NC |
| 12 | 0000Fh–CAM11 | NC |
| 13 | 28F32h–CAM12 | NC |
| 14 | 11F3Ah–CAM14 | 00111h (moved up in CAM14) |
| 15 | 21AABh–CAM15 | NC |
| 16 | 300FFh–CAM16 | NC |

FIG. 4B illustrates how the next free addresses are updated within three tables in response to three learn operations LEARN 1, LEARN 2 and LEARN 3 associated with databases 1, 4 and 14, respectively. With respect to the first database, the next free address 3ABF2h in FIG. 4A is updated to reflect a new next free address as 3ABF3h once a write operation has been performed to add one valid entry to the first database within the first CAM device (CAM1). This is illustrated in the rightmost column of TABLE 1. With respect to the fourth database, the next free address 2AAABh in FIG. 4A is updated to reflect a new next free address as 2FF11h (in CAM 3) once a write operation has been performed to add one valid entry to the fourth database within the fourth CAM device (CAM4). Finally, with respect to the fourteenth database, the next free address 11F3Ah in FIG. 4A is updated to reflect a new next free address as 00111h once a write operation has been performed to add one valid entry to the fourteenth database within the fourteenth CAM device (CAM4).

Referring now to FIG. 5, a search engine device 50 according to another embodiment of the present invention includes a multi-database CAM core 54 and control circuitry 52 that is configured to control operations (e.g., search, read, write) within the CAM core 54 and other internal circuitry (not shown). The search engine device 50 is illustrated as having three ports that are coupled to respective buses. These ports include an address port (ADDRESS), a data input port (DATA_IN) and a data output port (DATA_OUT). The ports, which may be of conventional design, may be operated at dual data rates (DDR) across a CAM interface. Other ports may also be provided. The search engine device 50 may be operated independently, in parallel with other search engine devices and within a cascaded chain network, such as the cascaded chain network illustrated by FIG. 3A.

The multiple databases within the CAM core 54 may represent tables for different applications. These tables may be searched sequentially in response to a single instruction loaded that is loaded into the search engine 50. In particular, an N-bit word that comprises (i) a multi-database search instruction (MDS_INST) and (ii) an encoded multi-database sub-word may be loaded into the search engine 50 in a single cycle. As illustrated by FIG. 6A, this instruction loading cycle is illustrated as a first cycle (shown as "$1^{st}$ Cycle"). Once the multi-database search instruction has been loaded during this first cycle, then sequential searches (i.e., look-ups) in multiple databases will operate to return valid hit or valid miss conditions for each designated database. Following the first cycle, a primary search key may be loaded into the search engine 50 during the second and third cycles. This primary search key may consist of search key segments 0 and 1, and search key segment 0 may constitute the most significant one of the two search key segments.

In order to prevent the CAM interface from being a bottleneck to system performance, the plurality of databases within the CAM core 54 may be searched using variations of a primary search key. Thus, it becomes unnecessary to repeatedly load the entire contents of each search key across the CAM interface for each search operation within a respective database. Instead, during the fourth through tenth cycles illustrated by FIG. 6A, the shorter replacement search key segments associated with the second through eighth search operations may be loaded into the search engine 50. These replacement search key segments, which are illustrated as REPLACEMENT KEY SEGMENTS 0–6, may be combined with one or more segments of the primary search key (or other search key) to define a desired search key for a respective search operation. This search key may constitute a search word (i.e., comparand) that is applied to a database within the CAM core or, more typically, the search key may be modified by a global mask stored within the search engine. Moreover, whereas FIG. 6A illustrates that a respective single cycle may be required to receive the multi-database search instruction and to receive each of the search key segments, alternative embodiments may use a fewer or larger number of cycles depending on the bandwidth requirements and capabilities of a particular system.

The designation of which databases are searched within the CAM core 54 may be provided by both the multi-database search instruction and the encoded multi-database sub-word. As illustrated by FIGS. 6B–6C, the multi-database search instruction may include a plurality of multi-bit instruction fields (shown as IFIELD1–IFIELDM) as well as a global mask field (shown as GMASK1) and a first database field (shown as DB1). The global mask field may include a value that specifies the location (e.g., address) of a global mask register within the search engine 50. This global mask register (not shown) may be configured to store the value of a global mask to be applied to a primary search key during a respective search operation. The first database field DB1, which is shown as a 4-bit field, specifies the database that is to undergo the first of the multiple search operations, using a first search word (i.e., first comparand) that is derived from the primary search key. As will be understood by those skilled in the art, a 4-bit field may be used to specify one of sixteen databases within the CAM core 54. Wider or narrower database fields may also be used in different applications.

In the event each multi-database search instruction (MDS_INST) results in the performance of eight consecutive search operations within the CAM core 54, for example, then the encoded multi-database sub-word may specify as many as seven additional databases to be searched following the search of the database designed within the multi-database search instruction. However, rather than requiring four bits of data to identify each of the seven additional databases, thereby resulting in 28 bits of data, an encoded multi-database sub-word having a length of only 16 bits may specify the seven databases to be searched based on bit position. The value of 28 bits is determined by multiplying the number of subsequent databases to be search, in this case seven (7), by the value of $\log_2 N_d$, in this case four (4), where $N_d$ represents the total number of available databases within the CAM core 54, in this case sixteen (16).

Figure 6D:
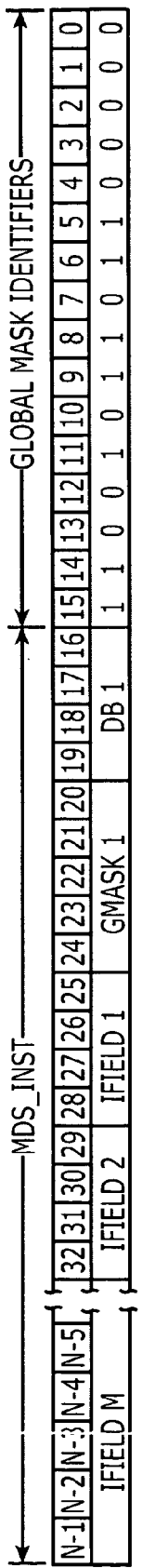
FIG. 6D illustrates a word having a multi-database instruction field (MDS_INST) and an encoded global mask identifier field therein.
Figure 6E:
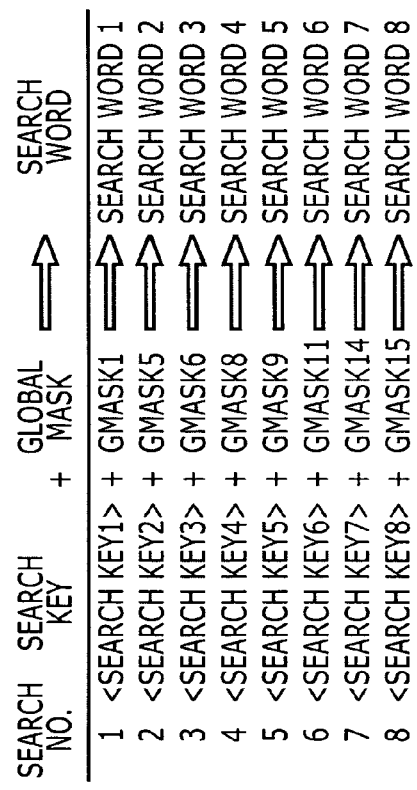
FIG. 6E is a table that illustrates how search words may be generated within the search engine device of FIG. 5.

The sixteen bits of data in the sub-word are identified by the label "Database Identifiers" in FIG. 6B. Accordingly, if a logic value of "1" is used to specify a database to be searched, then the 16-bit encoded sub-word illustrated by FIG. 16B will cause the second through eighth search operations to be performed in the following databases within the CAM core 54: 5,6,8,9,11,14 and 15. This sequence is also illustrated by the far right column in FIG. 6C, for the case where the value of the first database field DB1 equals the binary value of 0011 (i.e., database 3). The order of the databases to be searched is illustrated as following a right-to-left sequence of the logic 1 values in the encoded subword. A left-to-right or other sequence may also be followed in alternative embodiments. In still further search engine embodiments, the efficient encoding of the database sequence using a relatively few number of data bits may be used even when the same search key and possibly different global masks are used to define each search word (i.e., even when a search key replacement operation is not utilized). Alternatively, the database identifiers illustrated in FIG. 6B may be replaced in some embodiments by "Global Mask Identifiers" that specify which global masks are to be applied to a common search key (or possibly different search keys) when multiple searches of a designated database(s) are performed using a plurality of search words. Thus, as illustrated by FIG. 6D, the rightmost sixteen bit field may provide an encoded string of bits that identify which global masks are to be applied to search keys during corresponding search operations. These global mask values are identified by FIG. 6E, which shows that global masks 1,5,6,8,9,11,14 and 15 were used during respective search operations. These global masks may be retained in corresponding global mask registers (not shown).

FIG. 6C also illustrates how the replacement search key segments are combined with the first search key segment (KEY SEGMENT1) to define respective search keys. These search keys may be modified by respective global masks to define respective search words that are used as comparands during the search operations. In some cases, the global masks to be applied to the search keys associated with the second through eighth search operations may be retained in database configuration registers within the search engine 50. Accordingly, when generating the second and subsequent search words, it is unnecessary to reload reused portions of an earlier search key (e.g., KEY SEGMENT1) in advance of a respective search operation. Referring again to FIG. 6A, a new multi-database search instruction (MDS_INST2) may be loaded during the eleventh cycle and followed by a sequence of search key segments and replacement key segments during subsequent cycles. Moreover, each search operation within a respective database may commence upon receipt of a corresponding number of search key segments to be used during the respective search operation or multiple wait states may be incurred to allow sufficient time for loading of some or all search key segments to be used in response to a single multi-database search instruction.

In alternative embodiments, the second or subsequent search keys may be longer that the primary search key (or another previously received search key). For example, a second search key may comprise a new search key segment and one or more or even all of the search key segments from the already received first search key. Thus, a search of a database may be performed using the second search key (or search word derived from the second search key), but without requiring multiple consecutive data cycles to load the entire second search key. Likewise, a third search key may comprise a new search key segment and one or more or all of the search key segments within the second search key.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated circuit device, comprising:
   a search engine that supports a plurality of consecutive search operations in a corresponding plurality of databases within an internal CAM core using a corresponding plurality of search keys, said plurality of search keys comprising:
      a first search key that requires at least one data cycle to load into said search engine before a first search of a first one of the plurality of databases is performed using a first search word derived from the first search key; and
      a second search key that comprises a replacement search key segment and at least one search key segment from the first search key.

2. The device of claim 1, wherein the plurality of consecutive search operations comprises a second search of a second one of the plurality of databases using a second search word derived from the second search key.

3. The device of claim 2, wherein the second search key is shorter than the first search key.

4. The device of claim 2, wherein none of the plurality of search keys is longer than the first search key.

5. The device of claim 2, wherein the replacement search key segment requires one data cycle to load into said search engine.

6. The device of claim 5, wherein the plurality of search keys comprise a third search key that comprises another replacement search key segment and at least one search key segment from the first search key; wherein the another replacement search key segment requires one data cycle to load into said search engine; and wherein the another replacement search key segment is loaded into said search engine after the replacement search key segment is loaded into said search engine.

7. The device of claim 6, wherein the replacement search key segment and the another replacement search key segment have equivalent values.

8. The device of claim 7, wherein the plurality of consecutive search operations comprises a third search of a third one of the plurality of databases using a third search word derived from the third search key; and wherein the second and third search words are different.

9. The device of claim 2, wherein the first search key requires multiple data cycles to load into said search engine; and wherein the replacement search key segment requires fewer than the multiple data cycles to load into said search engine.

10. An integrated circuit device, comprising:
    a search engine that supports a plurality of consecutive search operations in a corresponding plurality of databases within an internal CAM core using a corresponding plurality of search keys, said plurality of search keys comprising:
       a first search key that requires at least one data cycle to load into said search engine before a search of a first of the plurality of databases is performed using a search word that is derived from the first search key; and
       a second search key that comprises at least one search key segment from the first search key and another search key segment that is loaded into said search engine after the first search key.

11. The device of claim 10, wherein the plurality of consecutive search operations comprises a second search of a second one of the plurality of databases using a second search word derived from the second search key.

12. The device of claim 11, wherein the second search key is longer than the first search key.

13. The device of claim 11, wherein the another search key segment requires one data cycle to load into said search engine.

14. An integrated circuit device, comprising:
a search engine that supports a plurality of consecutive search operations in a corresponding plurality of databases within an internal CAM core, using a corresponding plurality of search keys that include a longest first search key that requires multiple cycles to load into said search engine before a search of a first of the plurality of databases is performed and at least one shortest search key that requires fewer than the multiple cycles to load into said search engine and comprises a replacement search key segment and at least one search key segment derived from the longest first search key.

15. An integrated circuit device, comprising:
a search engine that supports a plurality of consecutive search operations in a corresponding plurality of databases within an internal CAM core using a corresponding plurality of search keys, said plurality of search keys comprising:
 a first search key that requires multiple data cycles to load into said search engine before a first search of a first one of the plurality of databases is performed;
 a second search key that comprises a first replacement search key segment and at least a first search key segment derived from the first search key; and
 a third search key that comprises a second replacement search key segment and at least a second search key segment derived from the first search key.

16. The device of claim 15, wherein the first search key segment and the second search key segment are equivalent search key segments.

17. The device of claim 15, wherein the first replacement search key segment requires only one data cycle to load into said search engine.

18. The device of claim 17, wherein the second replacement search key segment is loaded into said search engine after the first replacement search key is loaded into said search engine.

19. A method of operating a search engine device, comprising the steps of:
searching one or more databases within the search engine device using a first search key that takes multiple data cycles to load into the search engine device; and then
searching one or more databases within the search engine device using a second search key that is unequal to the first search key and comprises a search key segment from the first search key and a replacement search key segment that is loaded into the search engine device after the first search key has been loaded into the search engine device.

20. The method of claim 19, wherein the replacement search key segment requires one data cycle to load into the search engine device.

* * * * *